United States Patent
Park

(10) Patent No.: US 10,600,835 B2
(45) Date of Patent: Mar. 24, 2020

(54) ELECTRONIC MODULE AND METHOD OF MANUFACTURING THE SAME

(71) Applicant: Samsung Electro-Mechanics Co., Ltd., Suwon-si (KR)

(72) Inventor: Heung Woo Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/835,701

(22) Filed: Dec. 8, 2017

(65) Prior Publication Data

US 2018/0166485 A1 Jun. 14, 2018

(30) Foreign Application Priority Data

Dec. 12, 2016 (KR) ........................ 10-2016-0168809

(51) Int. Cl.
| | | |
|---|---|---|
| *H01L 27/146* | (2006.01) | |
| *H04N 5/225* | (2006.01) | |
| *G02B 13/16* | (2006.01) | |
| *G02B 7/08* | (2006.01) | |
| *G02B 5/20* | (2006.01) | |

(52) U.S. Cl.
CPC ...... *H01L 27/14621* (2013.01); *H01L 27/146* (2013.01); *H01L 27/14618* (2013.01); *H01L 27/14625* (2013.01); *H01L 27/14632* (2013.01); *H01L 27/14687* (2013.01); *H04N 5/2257* (2013.01); *G02B 5/208* (2013.01); *G02B 7/08* (2013.01); *G02B 13/16* (2013.01)

(58) Field of Classification Search
CPC ......... H01L 27/14618; H01L 27/14625; H01L 27/14683; H01L 2924/00; H04N 5/2257

USPC .. 257/E31.058, E31.063, E31.115, E25.032, 257/E27.133–E27.139, 414, 431, 432, 257/433, 435; 216/26; 438/116, 64, 66

See application file for complete search history.

(56) References Cited

U.S. PATENT DOCUMENTS

| | | | |
|---|---|---|---|
| 6,566,745 B1 | 5/2003 | Beyne et al. | |
| 6,777,767 B2 | 8/2004 | Badehi | |
| 10,157,943 B2 * | 12/2018 | Chen ..................... | H01L 23/544 |

(Continued)

FOREIGN PATENT DOCUMENTS

| | | | |
|---|---|---|---|
| JP | 7-202152 A | 8/1995 | |
| JP | 2987455 B2 | 12/1999 | |

(Continued)

*Primary Examiner* — Jonathan Han
(74) *Attorney, Agent, or Firm* — NSIP Law

(57) ABSTRACT

An electronic module includes a first component, a second component, a spacer, and an adhesive portion. The first component includes a first surface. The second component is disposed to be spaced apart from the first surface by a distance of about 40 μm to about 200 μm. The spacer spaces the first component and the second component apart from each other. The adhesive portion is disposed between the first surface and a bonding surface of the spacer facing the first surface. The spacer includes an inner spacer having a ring shape, and an outer spacer surrounding the inner spacer and disposed spaced apart from the inner spacer by 50% or less of an overall width of the inner spacer and the outer spacer, and an overall width of the adhesive portion is 100% to 150% of the overall width of the inner spacer and the outer spacer.

12 Claims, 4 Drawing Sheets

(56) References Cited

U.S. PATENT DOCUMENTS

| | | | |
|---|---|---|---|
| 2003/0042852 A1* | 3/2003 | Chen | H01L 51/5246 |
| | | | 313/512 |
| 2004/0159920 A1* | 8/2004 | Omori | H01L 23/04 |
| | | | 257/676 |
| 2004/0164981 A1 | 8/2004 | Fujita et al. | |
| 2009/0053850 A1* | 2/2009 | Nishida | H01L 27/14618 |
| | | | 438/64 |
| 2009/0200630 A1* | 8/2009 | Yamamoto | H01L 27/14618 |
| | | | 257/434 |
| 2010/0141825 A1 | 6/2010 | Kim et al. | |
| 2012/0018830 A1* | 1/2012 | Lin | H01L 27/14618 |
| | | | 257/432 |
| 2012/0147489 A1* | 6/2012 | Matsuoka | G02B 7/021 |
| | | | 359/819 |
| 2016/0337561 A1 | 11/2016 | Park et al. | |

FOREIGN PATENT DOCUMENTS

| | | |
|---|---|---|
| JP | 2002-76154 A | 3/2002 |
| KR | 10-0604190 B1 | 7/2006 |
| KR | 10-2008-0091439 A | 10/2008 |
| KR | 10-0915134 B1 | 9/2009 |
| KR | 10-2013-0076287 A | 7/2013 |
| KR | 10-2013-0089601 A | 8/2013 |
| KR | 10-1317983 B1 | 10/2013 |
| KR | 10-2016-0132745 A | 11/2016 |
| WO | WO 2007/034929 A1 | 3/2007 |

* cited by examiner

ELECTRONIC MODULE AND METHOD OF MANUFACTURING THE SAME

CROSS-REFERENCE TO RELATED APPLICATIONS

This application claims the benefit under 35 USC 119(a) of Korean Patent Application No. 10-2016-0168809 filed on Dec. 12, 2016, in the Korean Intellectual Property Office, the entire disclosure of which is incorporated herein by reference for all purposes.

BACKGROUND

1. Field

This application relates to an electronic module in which at least two components are stacked, and a method of manufacturing the same.

2. Description of Related Art

An image sensor, one of several electronic modules in a camera, may convert an optical signal including image information or distance (depth) information of a subject into an electrical signal.

An image sensor assembly may include the image sensor, a housing sealing the image sensor, and a filter (for example, an infrared filter) coupled to the housing to filter a specific component of incident light introduced into the image sensor.

However, in the image sensor assembly described above, the filter may be coupled to the housing, such that there may be a limitation in significantly reducing an interval between the filter and the image sensor. As a result, there may also be a limitation in significantly reducing an overall height of the image sensor assembly.

The above information disclosed in this Background section is only for enhancement of understanding of the background of the disclosure and therefore it may contain information that does not form any part of the prior art nor what the prior art may suggest to a person of ordinary skill in the art.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic module includes a first component, a second component, a spacer, and an adhesive portion. The first component includes a first surface. The second component is disposed to be spaced apart from the first surface by a distance of about 40 µm to about 200 µm. The spacer spaces the first component and the second component apart from each other. The adhesive portion is disposed between the first surface and a bonding surface of the spacer facing the first surface. The spacer includes an inner spacer having a ring shape, and an outer spacer surrounding the inner spacer and disposed to be spaced apart from the inner spacer, a spacing distance between the inner spacer and the outer spacer is 50% or less of an overall width of the inner spacer and the outer spacer, and an overall width of the adhesive portion is 100% to 150% of the overall width of the inner spacer and the outer spacer.

The adhesive portion may not be in contact with the second component.

The first component may include an image sensor having an effective pixel region disposed on the first surface, and the second component may include a cover disposed above the effective pixel region.

The spacer may include a ring shape, and be disposed to be spaced apart from the effective pixel region.

The image sensor may include electrodes disposed along a circumference of the effective pixel region and the spacer may be disposed between the effective pixel region and the electrodes.

The cover may include an infrared cut-off filter (IRCF). The IRCF may be a blue glass filter.

The adhesive portion may include a thermosetting adhesive solution.

The adhesive portion may further be disposed on the first surface between the inner spacer and the outer spacer. The adhesive portion may be bonded to an entire bonding surface of the spacer.

A camera module may include the electronic module disposed in a housing, and a lens portion disposed in the housing and configured to focus the image sensor.

In another general aspect, an electronic module includes a first component having a mounting surface, a second component having a protrusion portion disposed on one surface of the second component and on the mounting surface, and an adhesive portion bonding the protrusion portion to the mounting surface. The protrusion portion includes an inner spacer having a ring shape and an outer spacer surrounding the inner spacer and disposed spaced apart from the inner spacer. A spacing distance between the inner spacer and the outer spacer is 50% or less of an overall width of the inner spacer and the outer spacer. The adhesive portion is disposed beneath a surface of the protrusion portion. An overall width of the adhesive portion is 100% to 150% of the overall width of the inner spacer and the outer spacer.

A camera module may include the electronic module disposed on a substrate and a sealing portion disposed on the substrate. A circumference portion of the first component may be embedded in the sealing portion.

In another general aspect, a method to manufacture an electronic module includes applying an adhesive solution on an adhesion surface of a spacer, the spacer being disposed on a lower surface of a second component, seating the second component on a first component, making a surrounding temperature of the first component equal to or greater than room temperature and less than a hardening temperature of the adhesive solution, and hardening the adhesive solution to bond the first component and the second component to each other. The spacer includes an inner spacer comprising a ring shape and an outer spacer surrounding the inner spacer and disposed spaced apart from the inner spacer. A spacing distance between the inner spacer and the outer spacer is 50% or less of an overall width of the inner spacer and the outer spacer.

The first component may include an image sensor, and the second component may include a transparent cover. The adhesive solution may include a thermosetting adhesive solution.

Applying of the adhesive solution may include dipping a portion of the spacer into a dipping container in which the adhesive solution is filled. The dipping container may include an inlet through which gas is introduced into or discharged from an internal space of the spacer in a state in which the spacer is dipped in the adhesive solution.

The surrounding temperature of the first component may be reached by heating the first component.

The seating of the second component on the first component may include disposing adhesive solution in a space between the inner spacer and the outer spacer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

It will be understood that when an element or layer is referred to as being "on", "connected to", or "coupled to" another element or layer, it can be directly on, directly connected to, or directly coupled to the other element or layer, or intervening elements or layers may be present. In contrast, when an element or layer is referred to as being "directly on", "directly connected to", or "directly coupled to" another element or layer, there are no intervening elements or layers present.

In an example of an electronic module as described in this application, a second component may be stacked on and bonded to a first component. Here, the first component and the second component may include all the components included in the electronic module, such as an electronic device, a substrate, an optical filter, and the like.

Figure 1:
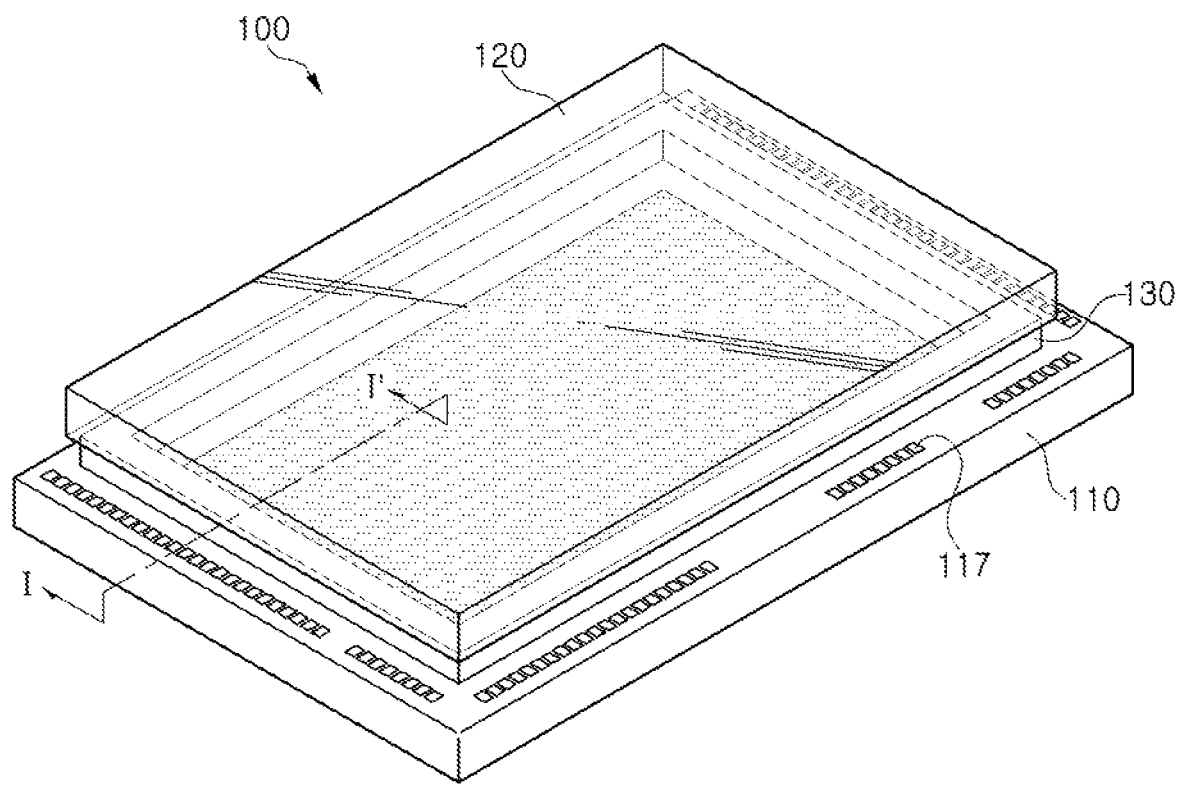
FIG. 1 is a schematic perspective view illustrating an example of an electronic module.

FIG. 1 is a schematic perspective view illustrating an example of an electronic module. In addition, FIG. 2 is a cross-sectional view taken along line I-I' of FIG. 1, and FIG. 3 is a cross-sectional view taken along line II-II' of FIG. 2.

Figure 2:
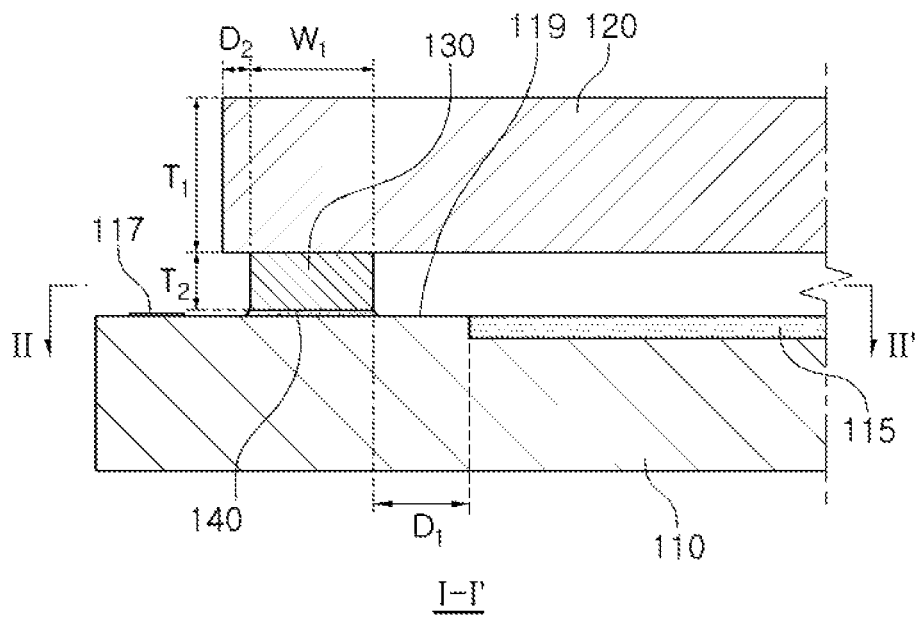
FIG. 2 is a cross-sectional view taken along line I-I' of FIG. 1.
Figure 3:
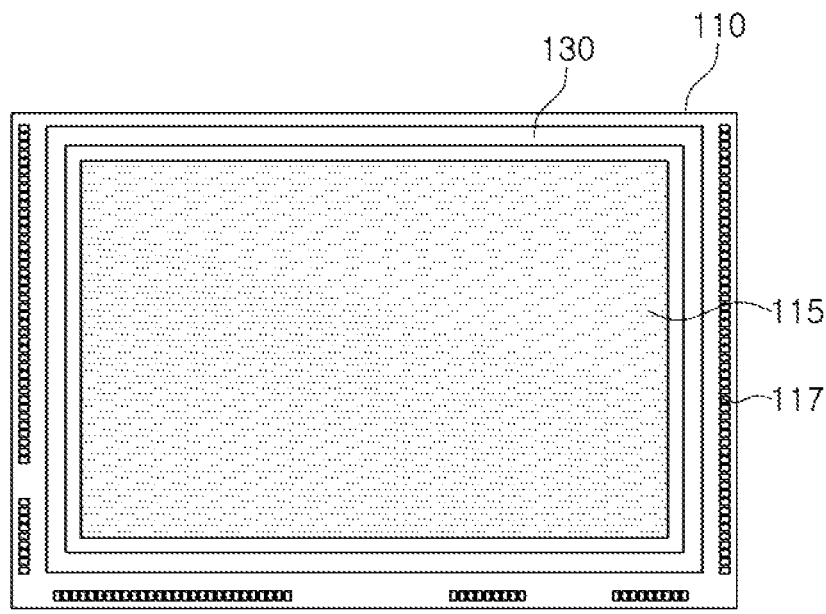
FIG. 3 is a cross-sectional view taken along line II-II' of FIG. 2.

Referring to FIGS. 1 through 3, the electronic module includes an image sensor assembly 100 mounted in a portable terminal. The image sensor assembly 100 includes an image sensor 110 and a cover 120.

The image sensor 110, is an example of a first component, and may be in a form of a chip having a rectangular shape. For example, a bare chip obtained by dicing a semiconductor wafer can be used as the image sensor 110.

An effective pixel region 115 to convert a photo-image of a subject formed by a lens portion 30 (see FIG. 8), for example, of an optical imaging system, into an electrical signal, and electrodes 117 to transmit the signal obtained from the effective pixel region 115 to an external device are formed on a first surface 119 of the image sensor 110. The first surface 119 is also referred to herein as a mounting surface of the image sensor 110 or an upper surface of the image sensor 110. As illustrated in FIG. 3, the electrodes 117 may be disposed outside of the effective pixel region 115 along a circumference of the effective pixel region 115. As used herein, circumference may refer to perimeter, periphery, border, or boundary, whether of a polygonal or curvilinear geometric shape in accordance with its ordinary and customary meaning.

The cover 120, a second component, is disposed above the effective pixel region 115 of the image sensor 110. When an optical filter is used as the second component, the second component may filter a specific component of incident light introduced into the image sensor 110. Here, the the cover 120 disposed above the effective pixel region 115 refers to the cover 120 disposed to be spaced apart from the effective pixel region 115, but disposed at a position adjacent and as close to the effective pixel region 115 as possible.

The cover 120 may have an upper surface, a lower surface opposite the upper surface, and an outer contour connecting the upper surface and lower surfaces at the perimeter of the cover 120.

The cover 120 is adhered to an upper surface 119 of the image sensor 110 through a spacer 130. Therefore, a spacing distance between the cover 120 and the image sensor 110 may be defined by the sum of a height of the spacer 130 and a height of an adhesive portion 140.

The cover 120 is formed of a transparent material so that light for forming an image is introduced into the image sensor 110. A cut-off filter (for example, an infrared cut-off filter (IRCF) preventing ultraviolet (UV) or infrared light other than a visible light from being introduced into the image sensor 110 may be used as the cover 120. For example, a blue glass (or a blue filter) for an infrared filter or a film filter is used as the cover 120.

When the IRCF or the blue glass is used as the cover 120, an additional, separate cover glass does not need to be added, and manufacturing costs of the electronic module may thus be reduced. In addition, the cover may be manufactured to have a quadrangular shape, and a circular IRCF or blue glass that it is relatively difficult to treat may thus be avoided. In addition, the spacer 130 to be described below is formed at a uniform height, and a deviation of a height of the electronic module may thus be significantly reduced. However, the material of the cover 120 is not limited to IRCF or blue glass. That is, various materials may be used as the material of the cover 120 as long as they permit light for forming an image to be incident to the effective pixel region 115 of the image sensor 110 and may protect the effective pixel region 115.

The spacer 130 may be formed on the lower surface of the cover 120.

The spacer 130 may be formed in a continuous ring shape along a contour of the effective pixel region 115. For example, when the effective pixel region 115 is formed in a quadrangular shape, the spacer 130 may also be formed in a quadrangular ring shape adjacent an outer periphery of the effective pixel region 115. Therefore, when the effective pixel region 115 is formed in another shape, the spacer 130 may also be formed in a ring shape corresponding to the shape of the effective pixel region 115. The spacer 130 may have an upper surface, a lower surface opposite the upper surface, an outer contour connecting the upper surface and the lower surface at an outer periphery of the spacer 130, and an inner contour connecting the upper surface and the lower surface at an inner contour of the spacer 130.

The spacer 130 is disposed between the effective pixel region 115 and the electrodes 117 of the image sensor 110. Therefore, the image sensor assembly 100 includes an internal space formed by the cover 120 and the spacer 130 and in which the effective pixel region 115 is disposed, and an external space in which the electrodes 117 are disposed.

The spacer 130 may be of a size so that it may be spaced apart from the effective pixel region 115 by a specified distance and may also be spaced apart from the electrodes 117 by a specified distance. This spacing may prevent an adhesion surface of an adhesive portion 140, to be described below, from being extended up to the effective pixel region 115 or the electrodes 117. When the adhesion portion 140 extends to the effective pixel region 115 or the electrodes 117, the adhesion portion 140 may pollute the effective pixel region 115 or the electrodes 117. Therefore, the spacing distances described above may be significantly reduced, as long as the extension of the adhesion surface is significantly reduced.

An area circumscribed by the outer contour of the spacer 130 may be smaller than an area circumscribed by the outer contour of the cover 120. In addition, the outer contour of the spacer 130 may be disposed to be spaced apart from the outer contour of the cover 120 by a predetermined distance. That is, the cover 120 may extend farther in a horizontal direction than the spacer 130, such that a portion of the cover 120 may overhang the outer contour of the spacer 130. However, the spacer 130 is not limited to the aforementioned configuration. That is, the outer counter of the spacer 130 and the outer contour of the cover 130 may also be disposed on the same vertical surface.

The spacer 130 may be formed on the lower surface of the cover 120 using a dry film photo-resist (DFR) or a photo-resist (PR). In this case, a separate adhesion member may not be interposed between the spacer 130 and the cover 120, and the spacer 130 may have a form of a protrusion portion protruding from the lower surface of the cover 120. Therefore, the spacer 130 may be understood to be a portion of the cover 120, which is the second component.

Epoxy or a polyimide based resin may be used as a material of the spacer 130. However, the material of the spacer 130 is not limited to these examples and may be modified in various ways, if necessary. For example, the spacer 130 may be formed of a metal.

In addition, the spacer 130 may be formed of a material that does not contain fillers. The fillers may be particles having a diameter of 1 μm or more.

When the fillers having the diameter of 1 μm or more are contained in the spacer 130, the fillers may act as a foreign material to cause a defect of a product. Therefore, the spacer 130 may contain particles having a diameter less than 1 μm.

In FIG. 2, an upper surface of the spacer 130 is adhered to the lower surface of the cover 120, and a lower surface of the spacer 130 is adhered to the upper surface of the image sensor 110. Here, the spacer 130 and the image sensor 110 are adhered to each other through the adhesive portion 140.

An internal space of the spacer 130 may be formed as a cavity. In addition, the internal space of the spacer 130 may be formed as a closed space. In this case, since the effective pixel region 115 is protected from the surrounding environment, even though the image sensor assembly 100 may be cleaned using a liquid such as water in a process of manufacturing the image sensor assembly 100, the liquid may not permeate into the effective pixel region 115. Therefore, a cleaning process may be easily performed. However, the spacer 130 according to the present disclosure is not limited thereto.

A thermosetting adhesive or a photosensitive adhesive may be used as the adhesive portion 140. For example, when the blue glass for an infrared filter is used as the cover 120, a UV wavelength may not be transmitted through the cover 120. Therefore, in this case, the thermosetting adhesive may be used as the adhesive portion 140. On the other hand, when the cover 120 is formed of a material through which the UV wavelength is transmitted, the photosensitive adhesive may be used as the adhesive portion 140.

In addition, the adhesive portion 140 may be mainly disposed on the lower surface of the spacer 130, and may not be substantially disposed on side surfaces of the spacer 130, as illustrated in FIG. 2. Therefore, the adhesive portion 140 may not be in contact with the cover 120, and most of the outer and inner contour side surfaces of the spacer 130 may be exposed outwardly of the adhesive portion 140.

The adhesive portion 140 may have an area similar to that of the lower surface of the spacer 130, as illustrated in FIG. 2. Here, the similar area is an area that is substantially the same as that of the lower surface of the spacer 130 or an area having a slight deviation from that of the lower surface of the spacer 130.

For example, the adhesive portion 140 has a width corresponding to about 100% to about 150% of a width of the spacer 130. In a method of manufacturing an electronic module according to this disclosure, as described below, an adhesive solution forming the adhesive portion 140 is hardly diffused, and the width of the adhesive portion 140 may thus be limited to the range described above.

In the present example, the width of the spacer 130 from the outer contour to the inner contour may be about 135 μm, and a height of the spacer 130 from the lower surface to the upper surface may be about 50 μm. When the width and the height of the spacer 130 are small, it may be difficult to apply the adhesive solution to only the lower surface of the spacer 130.

In addition, when an amount of applied adhesive solution is excessively large, the adhesive solution may easily extend to the cover 120 along surfaces of the spacer 130. Further, when an amount of applied adhesive solution is excessively small, the spacer 130 may not be completely bonded to the image sensor 110.

However, in the image sensor assembly 100, a thin layer of the adhesive solution may be applied to the entirety of the lower surface of the spacer 130 having a specified height by the method of manufacturing an electronic module to be described in more detail below, and the problem described above may thus be solved.

The adhesive portion 140 may be formed so that a lower bonded area thereof bonded to the mounting surface 119 of the image sensor 110 is greater than an upper bonded area thereof bonded to the lower surface of the spacer, by the method of manufacturing an electronic module described further below. However, the adhesive portion 140 is not limited to such a configuration.

Since an upper adhesion surface of the adhesive portion 140 has the area similar to that of the lower surface of the spacer 130, distances between the adhesive portion 140 and the effective pixel region 115 and between the adhesive portion 140 and the electrodes 117 of the image sensor 110 may be significantly reduced. This will be further described below.

The adhesive portion 140 and the effective pixel region 115 and the adhesive portion 140 and the electrodes 117 of the image sensor 110 need to be spaced apart from each other by a specified distance (for example, $D_1$ of FIG. 2 designates the distance the adhesive portion 140 and the effective pixel region 115 are spaced apart) in order to significantly reduce occurrences of defects of the image sensor assembly at the time of manufacturing the image sensor assembly. For example, this spacing is needed in order to significantly reduce a phenomenon of the adhesive solution forming the adhesive portion 140 introduced into or splashed on the effective pixel region 115 or the electrodes 117.

Therefore, as a width of the lower adhesion surface of the adhesive portion 140 becomes large, a distance between the effective pixel region 115 and the electrodes 117 needs also to be increased.

However, in the adhesive portion 140, the lower adhesion surface described above is not greatly extended from the spacer 130, but may be formed at a size corresponding to the area of the lower surface of the spacer 130. Therefore, the width of the lower adhesion surface may be significantly reduced, such that the distance between the effective pixel region 115 and the electrodes 117 of the image sensor 110 may also be significantly reduced.

In the image sensor assembly 100 according to the example configured as described above, the adhesive portion 140 may be uniformly disposed on the entirety of the lower surface of the spacer 130, and 95% or more of the adhesive portion 140 may be disposed between the image sensor 110 and the lower surface of the spacer 130.

Therefore, the adhesive portion 140 is not greatly extended outwardly from beneath the spacer 130, and the distance between the effective pixel region 115 and the electrodes 117 formed in the image sensor 110 may thus be significantly reduced. Therefore, a size of the image sensor 110 or the image sensor assembly 100 may also be significantly reduced.

In addition, the cover 120 is not coupled to a housing separate from the image sensor 120, but is adhered onto the image sensor 110 via the spacer 130. The distance between the cover 120 and the image sensor 110 may be about 40 μm to about 200 μm.

Here, the adhesive portion has a height of about 10 μm, and the spacer 130 thus has a minimum height of about 30 μm.

When a height of the spacer 130 is excessively short (for example, less than 30 μm), the adhesive solution may be stained on the cover 120 in a process of applying the adhesive solution to the spacer 130 for forming the adhesive portion 140, such that the cover 120 may be easily polluted.

In addition, when the cover 120 is disposed excessively close to the image sensor 110, foreign materials or defects of an optical coating film existing on the cover 120 may act as image defects to appear as defective pixels. Therefore, the spacing distance between the cover 120 and the image sensor 110 may be 40 μm or more.

In addition, when the cover 120 is disposed excessively far from the image sensor 110, a size of the image sensor assembly 100 may be increased, such that it may be difficult that the image sensor assembly 100 to be mounted in a terminal or a thin portable terminal. Therefore, the spacing distance between the cover 120 and the image sensor 110 may be 200 μm or less in consideration of a size of the image sensor assembly 100 that may be utilized.

In addition, in the image sensor assembly 100, the surrounding space of the effective pixel region 115 is closed by the cover 120, the spacer 130, and the adhesive portion 140, and a water cleaning process for removing foreign materials may thus be used after the cover 120 is attached, resulting in an increase in a production yield.

Now, an example of a method of manufacturing an example image sensor assembly will be described.

Figure 4:
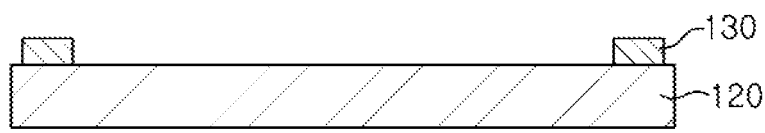
FIGS. 4 through 6 are views for describing an example method of manufacturing an example image sensor assembly.
Figure 5:
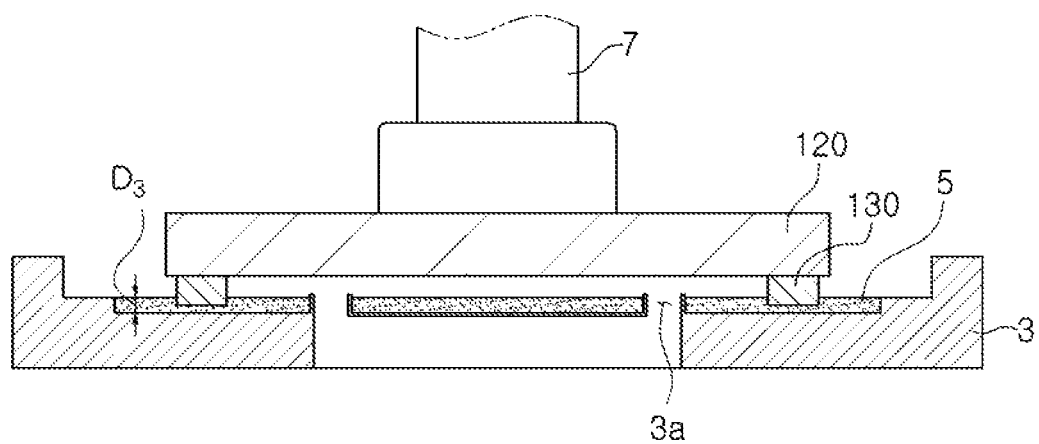
Figure 6:
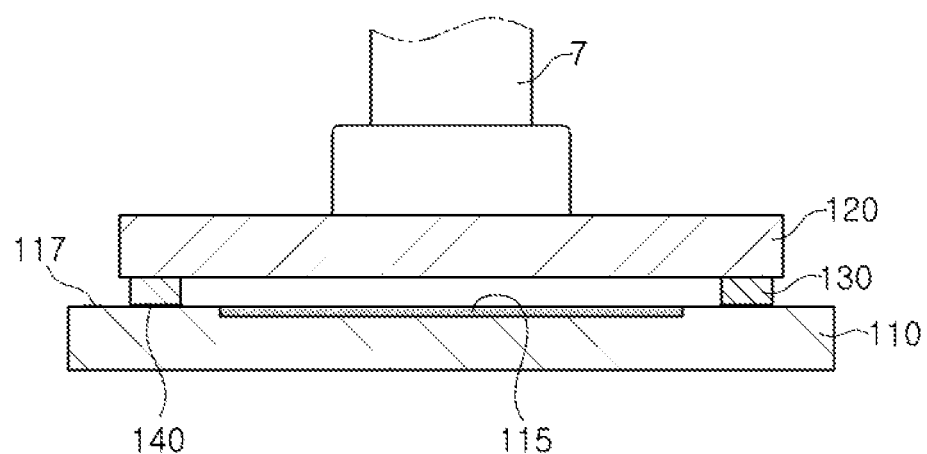

FIGS. 4 through 6 are views for describing the example method of manufacturing an example image sensor assembly.

Referring to FIGS. 4 through 6, the cover 120 is first prepared, and the spacer 130 is formed on the cover 120, as illustrated in FIG. 4. The spacer 130 may be formed by a method such as a printing method, a dispensing method, a photolithography method, or the like. For example, the spacer 130 is formed by disposing a DFR on one surface of the cover 120 and then partially removing the DFR through photolithography. However, the spacer 130 is not limited to the foregoing description.

A width or a height of the spacer 130 may be defined to correspond to a size of the cover 120. As illustrated in FIG. 2, a width W1 and a height $T_2$ of the spacer 130 may be about 135 μm and about 50 μm, respectively, with respect to the cover 120 having a height $T_1$ of 210 μm or less, and a distance $D_2$ by which the spacer 130 outer contour is spaced apart from the cover 120 outer contour may be about 25 μm. However, the width and the height of the spacer 130 and the distance between the spacer 130 outer contour and the cover 120 outer contour are not limited to these examples, and may be modified in various ways, if necessary.

As illustrated in FIG. 5, the adhesive solution 5 is applied to the spacer 130.

Here, the adhesive solution 5 may be applied in a dipping manner. In more detail, after the adhesive solution 5 is filled in a dipping container 3, a portion of the spacer 130 may be dipped in the adhesive solution 5 using a transfer member 7 to apply the adhesive solution 5 to a distal end of the spacer 130 at the lower surface of the spacer 130.

A UV curable adhesive solution, a low-temperature fast-curable adhesive solution, or combinations thereof may be used as the adhesive solution 5. For example, in the present example process, a process temperature may be lowered, such that it may be easier to manufacture the image sensor assembly. In addition, damage to the image sensor 110 due to a high process temperature may be significantly reduced.

In a dipping process, the spacer 130 may not be in contact with a bottom surface of the dipping container 3 in which the adhesive solution 5 is accommodated, and may be in contact with the adhesive solution. For example, the spacer 130 may be dipped in to the adhesive solution 5 to a depth of only about 30 μm in the dipping container 3. The dipping container 3 may have a depth $D_3$ of adhesive solution 5 greater than the dipping depth, for example, the depth $D_3$ of adhesive solution in the dipping container may be about 50 μm.

When the spacer 130 comes in contact with the bottom surface of the dipping container 3, the adhesive solution may be splashed on the cover 120 due to impact to cause a defect, such that an excessive amount of adhesive solution 5 may be unnecessarily applied to the spacer 130 or the adhesive solution 5 may be non-uniformly applied to the spacer 130.

Therefore, only the distal end (that is, the lower surface) of the spacer 130 may be dipped in the adhesive solution 5.

When a viscosity of the adhesive solution 5 is low (for example, 1,000 cps or less), the adhesive solution 5 may be splashed on the cover 120 in a process of dipping the spacer 130 in the adhesive solution 5, resulting in a defect. In addition, when a viscosity of the adhesive solution 5 is excessively high (for example, 100,000 cps or more), the adhesive solution 5 may be excessively applied to the spacer 130, such that the adhesion surface may be unnecessarily extended or the adhesive solution 5 may not be uniformly applied to the surface of the spacer 130.

Therefore, a solution having a viscosity in a range of about 1,000 cps to about 100,000 cps may be used as the adhesive solution 5 according to the present example.

A case in which the adhesive solution 5 having a viscosity of about 50,000 cps is used and the spacer 130 is dipped in to a depth of only about 30 μm in the adhesive solution 5 in the dipping container 3 having the depth $D_3$ of adhesive solution 5 of about 50 μm is described by way of example in the present example, but the present disclosure is not limited thereto.

When the distal end of the spacer 130 is dipped in the adhesive solution 5 in the present process, an internal space of the spacer 130 may be formed as a closed space by the adhesive solution 5. In this state, when the spacer 130 is lifted away from the dipping container 3, the adhesive solution 5 may come up along with the spacer 130 by adhesion up to a predetermined distance of the spacer 130 from the dipping container adhesion solution 5 surface (for example, about 0.5 mm).

Therefore, a volume of the closed internal space may be increased, and an internal pressure of the internal space may thus be reduced by the Boyle-Charles' law.

Therefore, a sudden air flow from an external space to the closed internal space may occur due to a pressure difference between the closed internal space and the external space at a point in time in which the adhesive solution 5 on the spacer 130 is separated from the adhesive solution 5 in the dipping container 3. Therefore, the adhesive solution 5 may be splashed on an inner surface of the spacer 130 or be diffused to be applied to the inner surface of the spacer 130, the cover 120, or the like.

Also, the adhesive solution 5 may not be uniformly applied, but may be gathered or lumped at any one side.

To this end, the dipping container 3 may include at least one inlet 3a. The inlet 3a is a path through which gas may be introduced into or discharged from the internal space of the spacer 130 in a state in which the spacer 130 is dipped in the adhesive solution.

Since the dipping container 3 includes the inlet 3a, the internal space of the spacer 130 may be maintained at the same pressure as that of the external space, and the problems described above may thus be solved.

As illustrated in FIG. 6, the cover 120 and the spacer 130 to which the adhesive solution 5 is applied may be adhered to the image sensor 110. More particularly, the cover 120 and the spacer 130 may be adhered to the image sensor 110 by seating the spacer 130 to which the adhesive solution 5 is applied on the image sensor 110 and then hardening the adhesive solution 5.

Various methods may be used in a process of hardening the adhesive solution 5, depending on a kind of adhesive solution 5. For example, when the adhesive solution 5 is a thermosetting adhesive solution, heat may be applied to the adhesive solution 5 to harden the adhesive solution 5, and when the adhesive solution is an ultraviolet (UV) curable adhesive solution, UV may be irradiated to the adhesive solution 5 to harden the adhesive solution 5. In addition, a material that does not include a volatile component such as an organic solvent may be used as the adhesive solution 5.

When the thermosetting adhesive solution is used as the adhesive solution 5, a process of applying the heat to the image sensor 110 may also be performed in the present process. A detailed description for such a process will be provided below.

In order to harden the thermosetting adhesive solution, the adhesive solution 5 needs to be heated up to a hardening temperature of the adhesive solution 5.

When the spacer 130 is seated on the image sensor 110, the internal space of the spacer 130 may be closed. However, the heat may also be applied to the closed internal space in a process of heating the adhesive solution 5, such that a pressure of the internal space may be increased.

When a pressure difference is generated between the internal space and the external space of the spacer 130 as described above and is intensified, heated gas (or air) of the internal space of the spacer 130 having a high pressure may push the adhesive solution 5 applied to the spacer 130 to deform the adhesive portion 140.

In this case, the cover 120 may be bonded to the image sensor 110 in a state in which it is inclined by the deformed adhesive portion 140. In addition, the heated gas may pass through the adhesive solution 5 and then erupt outwardly of the spacer 130 to generate a bonding defect.

In order to solve the problems described above, the process of bonding the cover 120 to the image sensor 110 may be performed by applying the heat to the image sensor 110. As the heat is applied to the image sensor 110, the surrounding temperature of the image sensor 110 may rise. As used herein, the surrounding temperature of the image sensor 110 is the temperature of the environment in which the image sensor 110 is disposed. The environment may be the air or an atmosphere surrounding the image sensor 110. Therefore, when the cover 120 to which the adhesive solution 5 is applied is seated on the image sensor 110, a temperature of the internal space of the spacer 130 may rise by the image sensor 110.

Therefore, even though the heat is applied to the adhesive solution 5, the temperature of the internal space of the spacer 130 is not significantly changed, such that the problem described above may be solved.

The surrounding temperature of the image sensor 110 needs to be lower than the hardening temperature of the adhesive solution 5. Therefore, the surrounding temperature of the image sensor 110 may be set to room temperature or a temperature higher than room temperature but lower than the hardening temperature of the adhesive solution 5.

The adhesive solution 5 is hardened, such that the image sensor assembly 100 illustrated in FIG. 1 may be completed.

A method of adhering the spacer 130 and the image sensor 110 to each other by applying the adhesive solution to the upper surface of the image sensor 110 in a dispensing manner rather than the dipping manner and then seating the spacer 130 on the adhesive solution may also be considered.

However, in this case, the adhesive solution is not linearly applied, but may be meanderingly applied to the image sensor 110 due to movement and shaking of a dispenser, and it may thus be easy that the adhesive solution is out of a bonded region of the spacer 130. In addition, since the adhesive solution is directly applied to the image sensor 110, the adhesive solution may flow along the surface of the image sensor 110, such that an adhesion area between the adhesive portion 140 and the image sensor 110 may be extended.

Further, when the dispensing manner is used, the adhesive solution is applied to the image sensor, and a tolerance may thus be generated between a position to which the adhesive solution is applied and a position of the spacer. Therefore, the adhesive solution may be applied at a width greater than that of the spacer in consideration of the tolerance.

When the dispensing manner is used as described above, the adhesive portion 140 may be excessively extended as compared to the lower surface of the spacer, and a spacing distance $D_1$ between the spacer 130 and the effective pixel region 115 thus may need to be relatively great.

However, when the dipping manner is used, the adhesive solution is applied to the lower surface of the spacer 130 rather than the image sensor 110, and a phenomenon that the adhesive solution flows along the surfaces of the image sensor 110 may thus be prevented.

It was measured through an experiment that when a width of the spacer 130 is 100 µm, an extended width of the adhesive solution is mainly within 50 µm. Therefore, a width of the adhesive portion 140 according to the present example may be 150% or less of the width of the spacer 130. However, when the width of the spacer 130 is excessively small (for example, 25 µm, or the like) or a viscosity or thixotropy of the adhesive solution is low, the width of the adhesive portion 140 may be extended. In this case, the width of the adhesive portion 140 may be 200% or less of the width of the spacer.

In addition, when the dipping manner is used, an alignment tolerance between the applied adhesive solution 5 and the spacer 130 may not exist, and an adhesion area of the adhesive portion 140 may have a size similar to that of the lower surface of the spacer 130.

Therefore, the spacing distance $D_1$ between the spacer 130 and the effective pixel region 115 may also be significantly reduced.

While a horizontal spacing distance $D_1$ between the spacer 130 and the effective pixel region 115 has been described as about 50 µm in the example illustrated in FIG. 2, the horizontal spacing distance $D_1$ between the spacer 130 and the effective pixel region 115, may not be so limited and may also be, for example, less than 50 µm, if necessary.

In the method of manufacturing an image sensor assembly according to the example described above, the adhesive portion 140 may be formed using the adhesive solution 5 to provide strong adhesion regardless of whether roughness or ruggedness of the surface of the image sensor 110 is formed.

In addition, since the adhesive solution 5 is applied to the spacer 130 in the dipping manner, the adhesive solution 5 may be very rapidly applied to the spacer 130, and productivity may thus be increased.

Figure 7:
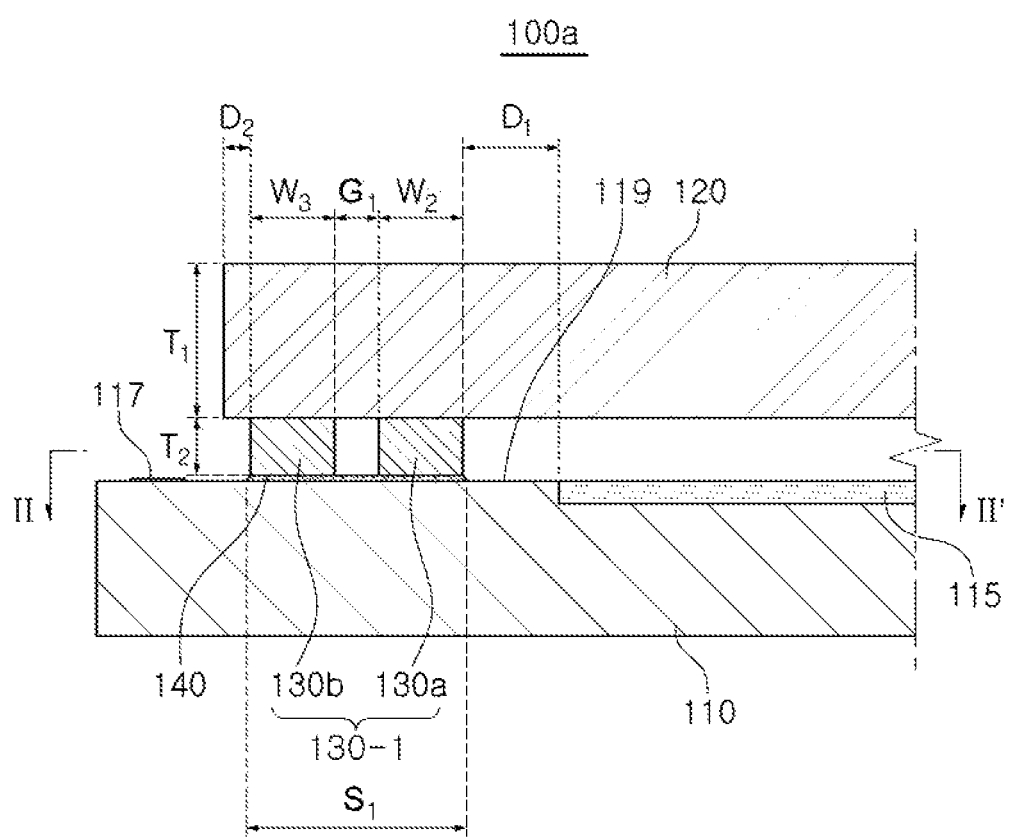
FIG. 7 is a schematic partial cross-sectional view illustrating another example of an electronic module.

FIG. 7 is a schematic partial cross-sectional view illustrating another example of an electronic module, which may be an alternative cross section to FIG. 2 corresponding to a view taken along line I-I' of FIG. 1.

Referring to FIG. 7, the electronic module is an image sensor assembly 100*a* mounted in a vehicle, and includes an image sensor 110 and a cover 120.

The electronic module according to this example may be similar to the electronic module according to the abovementioned example, and may be mainly different in a configuration of a spacer from the electronic module according to the abovementioned example. Therefore, a further detailed description for the same components as those of the electronic module described above may be omitted, and components different from those of the electronic module described above will be described hereinafter in greater detail.

According to the example of FIG. 7, the electronic module includes multiple spacers 130-1. In more detail, the spacer 130-1 includes an inner spacer 130*a* disposed adjacent to the effective pixel region 115 and an outer spacer 130*b* disposed adjacent to the electrodes 117 and surrounding the inner spacer 130*a*. However, the spacer 130-1 is not limited to this configuration, and may further include one or more spacers disposed between the inner spacer 130*a* and the outer spacer 130*b*, if necessary.

An outer contour of the outer spacer 130*b* may have a size smaller than that of an outer contour of the cover 120. For example, the outer contour of the outer spacer 130*b* is disposed to be spaced apart from the outer contour of the cover 120 by a specified distance. However, the outer contour of the outer spacer 130*b* is not limited to this configuration, and may also be disposed to be coplanar with the outer contour of the cover 120.

An internal space of the inner spacer 130*a* may be formed as a cavity.

The inner spacer 130*a* may be formed in a continuous ring shape, and the internal space of the inner spacer 130*a* may thus be formed as a closed space. In this case, since the effective pixel region 115 is protected from the surrounding environment, even though the image sensor assembly 100*a* is cleaned using water in a process of manufacturing the image sensor assembly 100*a*, the water may not permeate into the effective pixel region 115. Therefore, a cleaning process may be easily performed.

The inner spacer 130*a* and the outer spacer 130*b* may have the same height and the same width. However, the inner spacer 130*a* and the outer spacer 130*b* are not limited to this configuration, and may be variously modified. For example, a width $W_2$ of the inner spacer 130*a* and a width $W_3$ of the outer spacer 130*b* are different from each other.

A spacing distance $G_1$ between the inner spacer 130*a* and the outer spacer 130*b* may be changed depending on a material of the spacer 130-1. In addition, the spacing distance $G_1$ may be changed depending on a size of the electronic module, an overall width of the spacer 130-1, or the like.

For example, the spacing distance $G_1$ is defined to be a distance within 50% of the overall width ($W_2+W_3$) of the inner spacer 130*a* and the outer spacer 130*b*. In addition, since the adhesive portion 140 is extended from the spacer by a predetermined portion, an overall width $S_1$ of the adhesive portion 140 may be in a range of 100% to 150% of the overall width ($W_2+W_3$) of the spacer 130-1.

When the spacing distance $G_1$ between the spacers 130*a* and 130*b* is excessively great, the adhesive portion 140 may not be disposed between the inner spacer 130*a* and the outer spacer 130*b*. In this case, adhesion between the spacers 130*a* and 130*b* and the image sensor 110 may be reduced.

Therefore, the spacing distance $G_1$ between the inner spacer 130*a* and the outer spacer 130*b* may be limited to a maximum distance enough to form the adhesive portion 140 in a space between the inner spacer 130a and the outer spacer 130b in a dipping manner.

The spacing distance $G_1$ may be similar to or smaller than the width $W_2$ of the inner spacer 130a or the width $W_3$ of the outer spacer 130b.

In addition, the spacer 130-1 may be formed by forming a DFR on one surface of the cover 120 and then partially removing the DFR through photolithography. Therefore, a minimum spacing distance between the spacers 130a and 130b may be defined by a material of the spacer 130-1 and a photolithography manner.

Each of the widths $W_2$ and $W_3$ of the inner spacer 130a and the outer spacer 130b may be about 100 µm. In addition, the spacing distance $G_1$ between the inner spacer 130a and the outer spacer 130b may be about 50 µm.

Therefore, the overall width ($W_2+W_3$) of the inner spacer 130a and the outer spacer 130b may be about 200 µm, and the overall width $S_1$ of a spacer region including the spacing distance $G_1$ may be about 250 µm. However, the spacer 130-1 is not limited to such a configuration.

The adhesive portion 140 may be disposed on a lower surface of the inner spacer 130a and a lower surface of the outer spacer 130b. In addition, the adhesive portion 140 may also be disposed between the inner spacer 130a and the outer spacer 130b. Therefore, the adhesive portion 140 may be disposed in the entire region of the spacer 130-1.

When the inner spacer 130a and the outer spacer 130b are used in the electronic module mounted in the portable terminal according to the abovementioned example, each of the inner spacer 130a and the outer spacer 130b may be formed at a width of about 50 µm. In addition, the spacing distance between the inner spacer and the outer spacer may be about 25 µm.

In the image sensor assembly 100, the spacer 130-1 allowing the cover 120 and the image sensor 110 to be spaced apart from each other may be formed through the two spacers 130a and 130b disposed in parallel with each other. In addition, the adhesive portion 140 may be provided between the two spacers 130a and 130b as well as on the lower surfaces of the spacers 130a and 130b.

Therefore, an adhesion area may be significantly increased, and thus adhesion may be increased.

Further, since the surrounding space of the effective pixel region 115 is closed by the cover 120, the spacer 130-1, and the adhesion part 140, a water cleaning process for removing foreign material may be used after the cover 120 is attached, thereby increasing a production yield.

Figure 8:
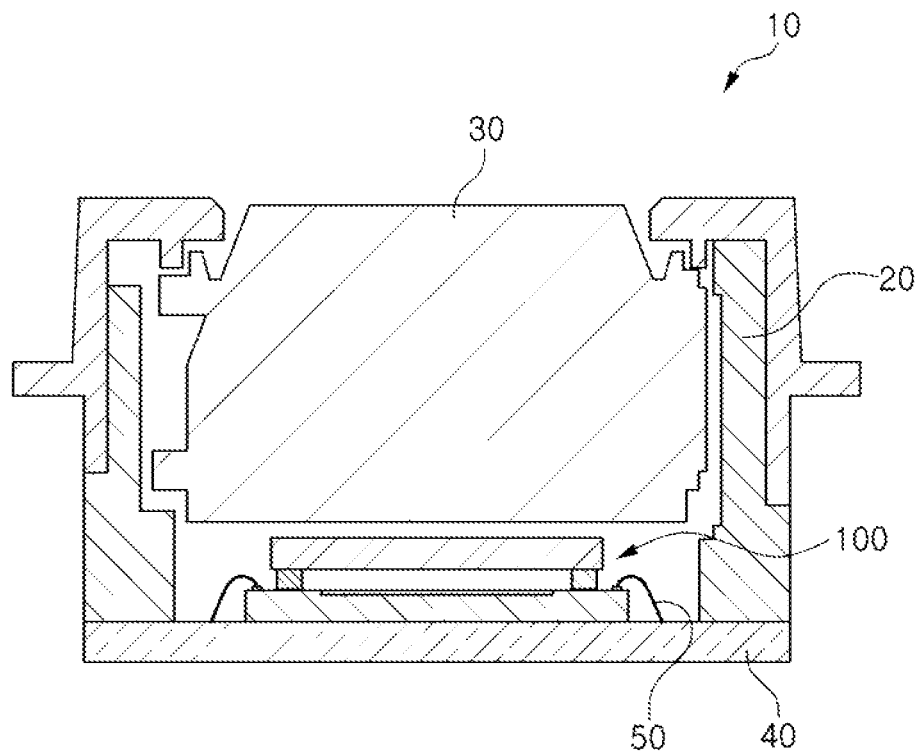
FIG. 8 is a schematic cross-sectional view illustrating an example of a camera module.

FIG. 8 is a schematic cross-sectional view illustrating an example of a camera module 10.

Referring to FIG. 8, the example camera module 10 may be mounted in a portable terminal, and includes the image sensor assembly 100 described above with reference to FIG. 2 or the image sensor assembly 100a described above with reference to FIG. 7, a substrate 40, a housing 20, and the lens portion 30 coupled to the housing 20.

The substrate 40 may have wirings formed thereon, and an image sensor 110 is seated on an upper surface of the substrate 40.

External connection terminals (not illustrated) such as conductive pads and pins electrically connected to the image sensor 110 may be formed on the substrate 40. A case in which the substrate 40 and the image sensor 110 are electrically connected to each other by bonding wires 50 is described by way of example. However, a manner of connecting the substrate 40 and the image sensor 110 to each other is not limited to this example, and may be modified in various ways. For example, the substrate 40 and the image sensor 110 may be connected to each other in a flip-chip bonding manner.

Various types of substrates such as a printed circuit board (PCB), a flexible substrate, a ceramic substrate, a glass substrate, and the like, may be used as the substrate 40 as long as wirings are formed thereon.

The lens portion 30 includes one or more lenses, and is coupled to the housing 20. The lens portion 30 may be coupled to the housing 20 so that the lens or the entire lens portion 30 is movable in order to focus an optical system.

The housing 20 includes an internal space so that the lens portion 30 is accommodated therein, and supports the lens portion 30. In addition, the substrate 40 may be coupled to a lower end of the housing 20. The substrate 40 may be coupled to the housing 20 so that the image sensor assembly 100 is accommodated in the housing 20.

In the camera module 10, a cover is not directly attached to the housing, but may be attached to the image sensor. Therefore, a height of the camera module may be reduced as compared to the camera module according to the instance in which the cover is directly coupled to the housing separately from the image sensor, such that the camera module may be easily mounted in a thin portable terminal.

Figure 9:
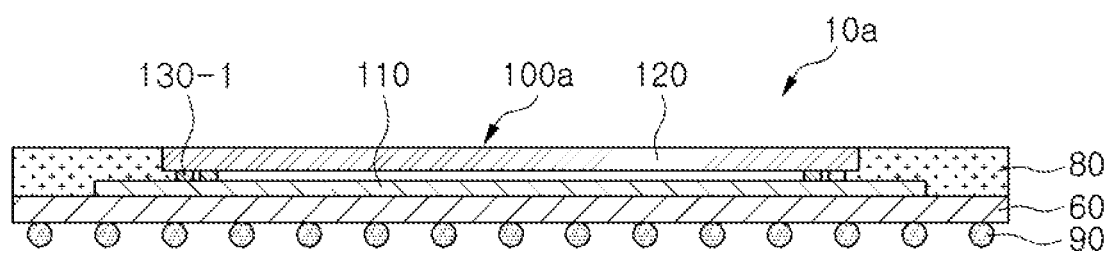
FIG. 9 is a schematic cross-sectional view illustrating another example of a camera module.

FIG. 9 is a schematic cross-sectional view illustrating another example of a camera module 10a.

Referring to FIG. 9, the camera module 10a may be mounted in a vehicle, and includes the image sensor assembly 100a described above with reference to FIG. 7 or the image sensor assembly 100 described above with reference to FIG. 2, a substrate 60, and a sealing portion 80.

The substrate 60 may have wirings formed thereon, and an image sensor 110 is seated on an upper surface of the substrate 60.

Conductive pads (not illustrated) electrically connected to the image sensor 110 may be formed on a mounting surface of the substrate 60. In addition, external connection terminals 90 are disposed on a non-mounting surface of the substrate 60. Various types of substrates such as a PCB, a flexible substrate, a ceramic substrate, a glass substrate, and the like, may be used as the substrate 60 including wirings formed thereon.

The sealing portion 80 seals a circumference of the image sensor assembly 100a mounted on the substrate 60. The sealing portion 80 may be formed of an insulating resin such as an epoxy molding compound (EMC), and may be disposed on the substrate 60 to embed a circumference portion of the image sensor 110 therein.

Bonding reliability between a cover 120 and the image sensor 110 may be increased by the sealing portion 80. Therefore, even in the case that adhesion between the adhesive portion 140 (see FIG. 7) interposed between the spacer 130-1 and the image sensor 110 is weak, insufficient adhesion may be compensated for by the sealing portion 80.

Therefore, the spacer 130-1 may be formed at a smaller width in the camera module that includes the sealing portion 80 than in a camera module that does not include the sealing portion 80.

As set forth above, in the example electronic modules, the distance between the effective pixel region and the electrodes formed in the image sensor may be significantly reduced, and the size of the image sensor or the image sensor assembly may thus be significantly reduced.

In addition, since the cover is not coupled to the housing, but is directly adhered to the image sensor via the spacer, the distance between the cover and the image sensor may be significantly reduced, and the height of the image sensor assembly may thus be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic module comprising:
    a first component comprising a first surface;
    a second component disposed to be spaced apart from the first surface by a distance of about 40 μm to about 200 μm;
    an inner spacer spacing the first component and the second component apart from each other;
    an outer spacer spacing the first component and the second component apart from each other, the outer spacer surrounding the inner spacer and being spaced apart from the inner spacer; and
    an adhesive portion disposed on the first surface of the first component between the first surface of the first component and bonding surfaces of the inner spacer and the outer spacer, and disposed on the first surface of the first component along a space between the inner spacer and the outer spacer,
    wherein a spacing distance between the inner spacer and the outer spacer is 50% or less of an overall width of the inner spacer and the outer spacer, and
    wherein an overall width of the adhesive portion is 100% to 150% of the overall width of the inner spacer and the outer spacer.

2. The electronic module of claim 1, wherein the adhesive portion is not in contact with the second component.

3. The electronic module of claim 1, wherein the first component comprises an image sensor comprising an effective pixel region disposed on the first surface, and the second component comprises a cover disposed above the effective pixel region.

4. The electronic module of claim 3, wherein the inner spacer comprises a ring shape, and is disposed to be spaced apart from the effective pixel region.

5. The electronic module of claim 4, wherein the image sensor comprises electrodes disposed along a circumference of the effective pixel region, and
    the inner spacer and the outer spacer are disposed between the effective pixel region and the electrodes.

6. The electronic module of claim 3, wherein the cover comprises an infrared cut-off filter (IRCF).

7. The electronic module of claim 6, wherein the IRCF is a blue glass filter.

8. A camera module, comprising:
    the electronic module of claim 3 disposed in a housing; and
    a lens portion disposed in the housing and configured to focus the image sensor.

9. The electronic module of claim 1, wherein the adhesive portion comprises a thermosetting adhesive solution.

10. The electronic module of claim 1, wherein the adhesive portion is bonded to an entirety of the bonding surfaces of the inner spacer and the outer spacer.

11. An electronic module comprising:
    a first component comprising a mounting surface;
    a second component comprising a protrusion portion disposed on one surface of the second component and on the mounting surface; and
    an adhesive portion bonding the protrusion portion to the mounting surface,
    wherein the protrusion portion comprises an inner spacer having a ring shape and an outer spacer surrounding the inner spacer and disposed spaced apart from the inner spacer,
    wherein a spacing distance between the inner spacer and the outer spacer is 50% or less of an overall width of the inner spacer and the outer spacer,
    wherein the adhesive portion is disposed on the mounting surface of the first component between the mounting surface of the first component and bonding surfaces of the inner spacer and the outer spacer, and disposed on the mounting surface of the first component along a space between the inner spacer and the outer spacer,
    wherein an overall width of the adhesive portion is 100% to 150% of the overall width of the inner spacer and the outer spacer.

12. A camera module, comprising:
    the electronic module of claim 11 disposed on a substrate; and
    a sealing portion disposed on the substrate, wherein a circumference portion of the first component is embedded in the sealing portion.

* * * * *